(12) United States Patent
Holbery et al.

(10) Patent No.: US 9,930,773 B2
(45) Date of Patent: Mar. 27, 2018

(54) FLEXIBLE INTERCONNECT

(71) Applicant: Microsoft Technology Licensing, LLC, Redmond, WA (US)

(72) Inventors: James David Holbery, Bellevue, WA (US); Siyuan Ma, Redmond, WA (US); Michael David Dickey, Raleigh, NC (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 40 days.

(21) Appl. No.: 15/188,453

(22) Filed: Jun. 21, 2016

(65) Prior Publication Data

US 2017/0367179 A1    Dec. 21, 2017

(51) Int. Cl.
| | |
|---|---|
| *H05K 1/00* | (2006.01) |
| *H05K 1/02* | (2006.01) |
| *H05K 1/03* | (2006.01) |
| *H05K 1/09* | (2006.01) |
| *H05K 3/10* | (2006.01) |
| *H05K 3/46* | (2006.01) |
| *G06F 1/16* | (2006.01) |

(52) U.S. Cl.
CPC ......... *H05K 1/0272* (2013.01); *G06F 1/1613* (2013.01); *H05K 1/028* (2013.01); *H05K 1/03* (2013.01); *H05K 1/092* (2013.01); *H05K 3/10* (2013.01); *H05K 3/4644* (2013.01); *H05K 2201/032* (2013.01); *H05K 2201/09009* (2013.01)

(58) Field of Classification Search
USPC ................................................. 361/749, 748
See application file for complete search history.

(56) References Cited

U.S. PATENT DOCUMENTS

| | | |
|---|---|---|
| 3,097,031 A | 7/1963 | Cooley |
| 6,740,829 B1 | 5/2004 | Wong |
| 6,806,431 B2 | 10/2004 | Kondoh et al. |
| 6,884,951 B1 | 4/2005 | Wong |
| 8,089,434 B2 | 1/2012 | Moore et al. |
| 9,019,696 B2 | 4/2015 | Hamers et al. |
| 9,116,145 B2 | 8/2015 | Li et al. |

(Continued)

FOREIGN PATENT DOCUMENTS

| | | |
|---|---|---|
| CN | 204463715 U | 7/2015 |
| CN | 204596469 U | 8/2015 |

OTHER PUBLICATIONS

Paik, et al., "Stretchable Circuits and Sensors for Robotic Origami", in Proceedings of the IEEE/RSJ International Conference on Intelligent Robots and Systems, Sep. 25, 2011, pp. 414-420.

(Continued)

*Primary Examiner* — Andargie M Aychillhum
(74) *Attorney, Agent, or Firm* — Alleman Hall Creasman & Tuttle LLP

(57) ABSTRACT

Examples are provided for a flexible circuit element including a flexible insulating support structure, a solid metal trace extending at least partially between a first connector and a second connector on the flexible insulating support structure, and a liquid metal conductor disposed in contact with the solid metal trace in a region of the trace configured to repeatedly flex when installed in a device.

15 Claims, 6 Drawing Sheets

(56) References Cited

U.S. PATENT DOCUMENTS

| | | | |
|---|---|---|---|
| 9,171,794 | B2 | 10/2015 | Rafferty et al. |
| 2007/0296767 | A1 | 12/2007 | Anderson et al. |
| 2009/0001576 | A1 | 1/2009 | Tuli et al. |
| 2011/0075382 | A1* | 3/2011 | MacKey ................. G06F 3/044 361/749 |
| 2014/0354318 | A1 | 12/2014 | Oh et al. |
| 2016/0109908 | A1 | 4/2016 | Siddiqui |
| 2016/0205766 | A1* | 7/2016 | Blum ................... H05K 1/0216 361/749 |

OTHER PUBLICATIONS

Nawaz, et al., "Unconventional microfluidics: expanding the discipline", in Journal of Lab Chip, vol. 13, No. 8, Apr. 21, 2013, pp. 1457-1463.

Larmagnac, et al., "Stretchable electronics based on Ag-PDMS composites", in Journal of Scientific reports, vol. 4, Article 7254, Dec. 1, 2014, pp. 1-7.

Dickey, Michael D., "Emerging Applications of Liquid Metals Featuring Surface Oxides", in Journal of ACS Applied Materials & Interfaces, vol. 6, Issue 21, Oct. 6, 2014, pp. 18369-18379.

Vogt, et al., "Design and Characterization of a Soft Multi-Axis Force Sensor Using Embedded Microfluidic Channels", in Journal of IEEE Sensors, vol. 13, No. 10, Oct. 2013, pp. 4056-4064.

Wu, et al., "Microfluidic Stretchable Radio-Frequency Devices", in Proceedings of the IEEE, vol. 103, Issue 7, Jul. 2015, pp. 1211-1225.

"International Search Report and Written Opinion Issued in PCT Application No. PCT/US2017/036932", dated Sep. 15, 2017, 10 Pages.

* cited by examiner

FLEXIBLE INTERCONNECT

BACKGROUND

Flexible electrical interconnects may be used to connect electronic components located in portions of a device that are moveable relative to one another. In such a device, a flexible interconnect may be subject to a large number of flexing cycles over a lifetime of the device.

SUMMARY

Examples are disclosed that relate to flexible electrical interconnects. One example provides a flexible circuit element including a flexible insulating support structure, a solid metal trace extending at least partially between a first connector and a second connector on the flexible insulating support structure, and a liquid metal conductor disposed in contact with the solid metal trace in a region of the trace configured to repeatedly flex when installed in a device.

This Summary is provided to introduce a selection of concepts in a simplified form that are further described below in the Detailed Description. This Summary is not intended to identify key features or essential features of the claimed subject matter, or is it intended to be used to limit the scope of the claimed subject matter. Furthermore, the claimed subject matter is not limited to implementations that solve any or all disadvantages noted in any part of this disclosure.

DETAILED DESCRIPTION

Electrical interconnects may be incorporated into a variety of devices to provide electrical pathways between device components. Some electronic devices may include joints, hinges, and/or other moveable structures that connect two parts each having electronic components. In such structures, a flexible interconnect may be utilized to bridge the components to allow the components to remain electrically interconnected as the components are bent and/or rotated relative to one another.

Flexible interconnects are commonly formed from solid metal traces, such as copper, patterned on a flexible substrate, such as a polyimide film. However, the solid metal traces may fatigue over time after repeated flexing, which may lead to breakage of the traces, thereby disrupting the electrical connection between the components. Even solid metal traces that are able to withstand a particular frequency of flexing may fail due to pinch points, strain, twist, and/or other modes of deformation (e.g., without even cycling through repeated flexing).

Accordingly, examples of flexible circuit elements that incorporate liquid metal conductors are disclosed. The use of a liquid metal conductor in a flexible circuit element may help to resist circuit breakage from repeated flexing and/or other modes of deformation of the circuit element compared to interconnects that use only solid metal traces, even when repeatedly bent to high angles (e.g. approximately 180 degrees in either direction) or deformed with a high and/or concentrated level of force.

Figure 1A:
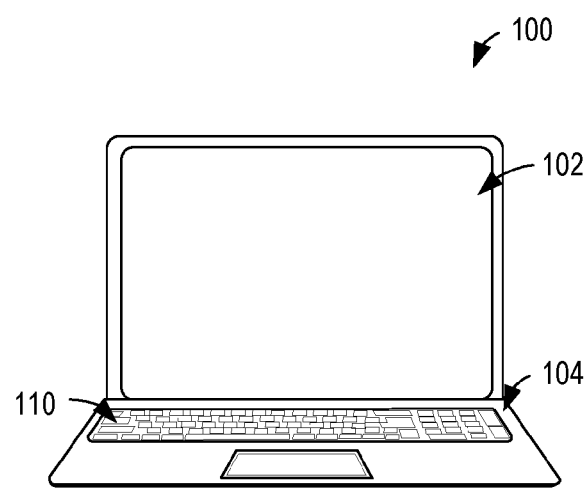
FIG. 1A shows a front view of an example computing system.
Figure 1B:
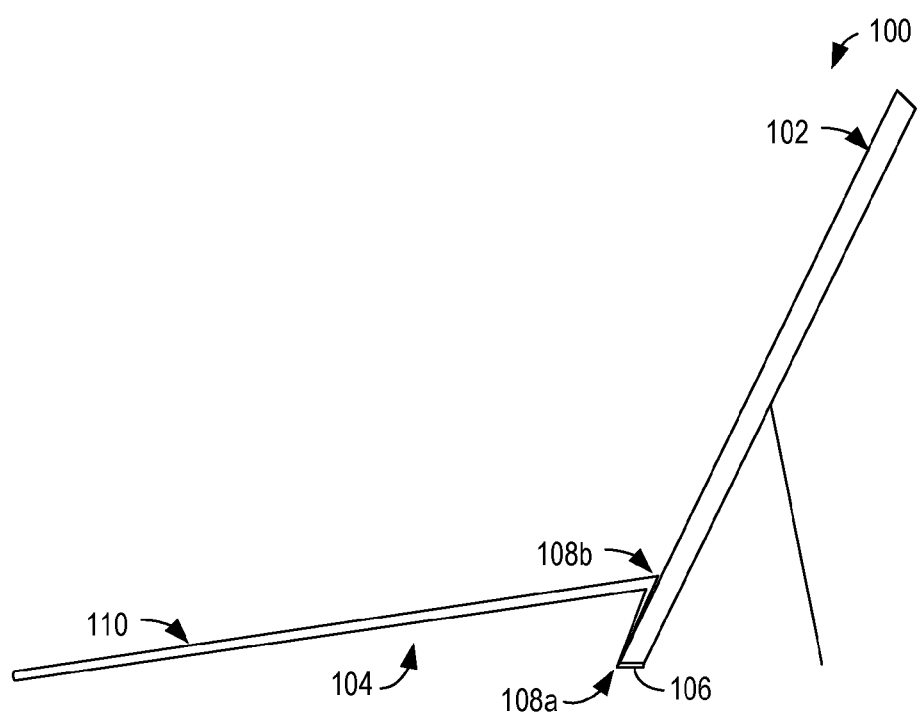
FIG. 1B shows a side view of the example computing system of FIG. 1A.
Figure 1C:
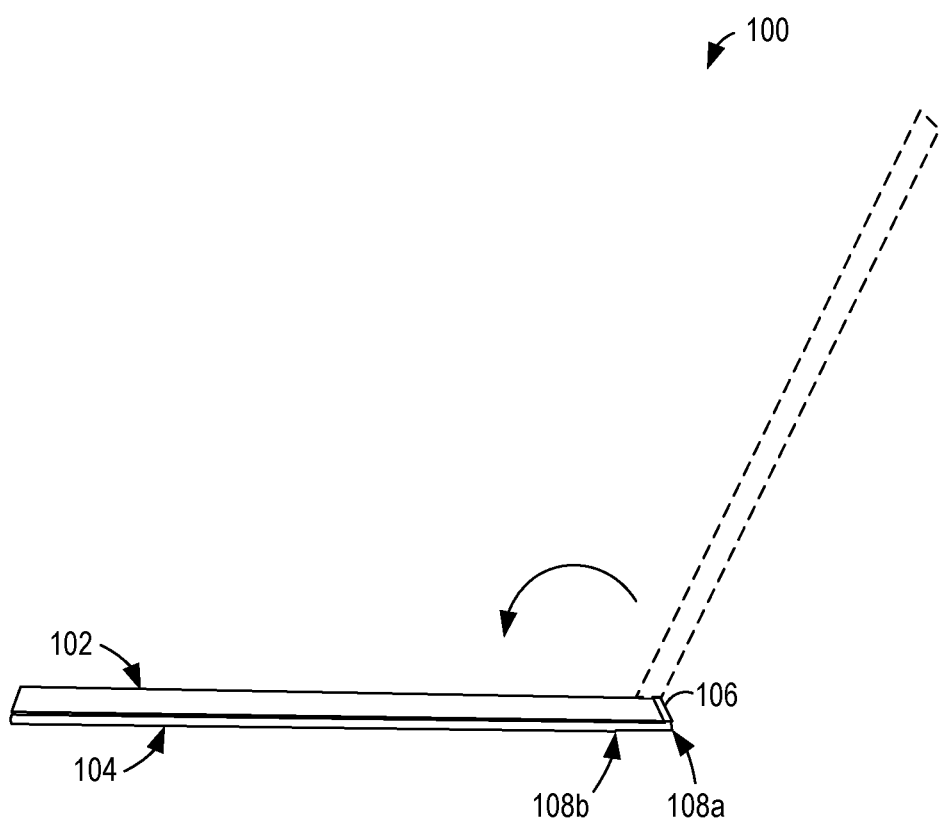
FIG. 1C shows a side view of the example computing system of FIG. 1A in a closed state.

FIGS. 1A-1C show an example computing system 100 in the form of a tablet having a display 102. The computing system is connected to a detachable keyboard unit 104 via a connector 106. The keyboard unit 104 comprises a flexible interconnect that electrically connects keys 110 and other electrical components of the keyboard unit 104 to the computing system 100 via the connector 106.

The keyboard unit 104 and the flexible interconnect positioned therein bend around a bottom corner of the display to a front of the display 102 in a first flex region 108a. As illustrated, the bend in this region is relatively sharp, conforming closely to the corner of the computing system 100. The keyboard unit 104 continues up the front surface of the display, and bends sharply down and away from the front surface of the display in a second flex region 108b. The bend in this region is also sharp. FIG. 1C shows flex region 108b in a straightened configuration when the computing device 100 and keyboard unit 104 are in a "closed" position, as opposed to an "open" position shown in FIGS. 1A-1B. Flex region 108a also may be straightened in a similar manner, for example, when the keyboard unit 104 is removed from the computing device. In other examples, an electronic device that utilizes a flexible interconnect may take any other suitable form.

As the keyboard unit potentially may be moved between the "open" and "closed" positions, as well as other possible positions, multiple times a day for years of use, the flex regions 108a-b may flex a very large number of times during the device lifetime. Thus, a flexible interconnect having a liquid metal may be used to help prevent loss of conductivity in the event that a solid conductor in the trace is broken from fatigue.

Figure 2:
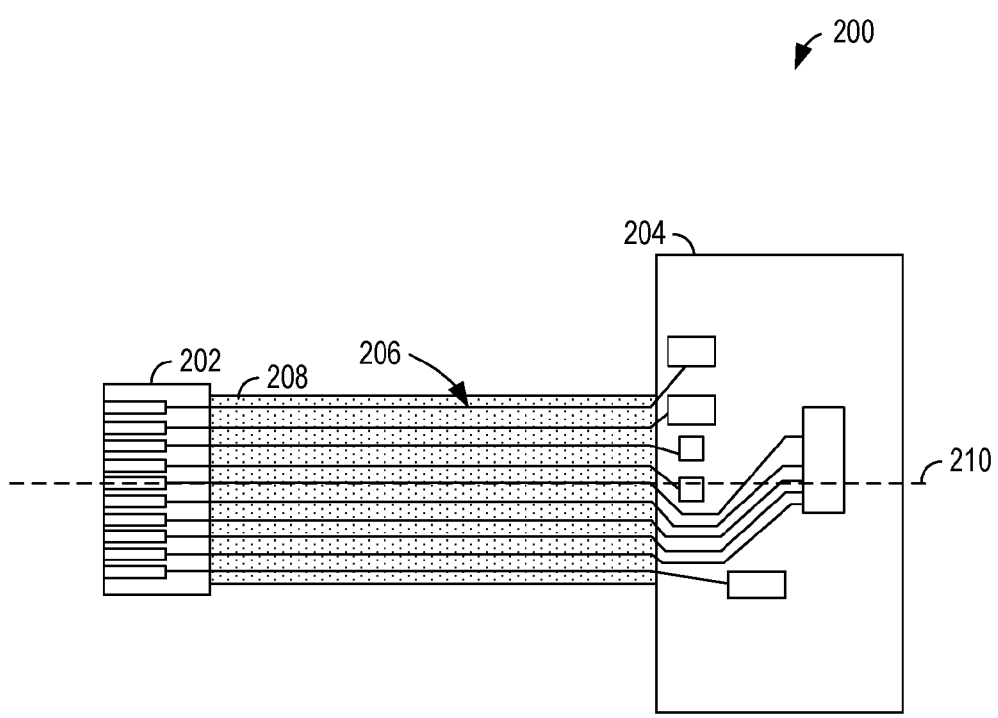
FIG. 2 shows a schematic view of an example flexible interconnect between two electrical components.

FIG. 2 shows an example flexible interconnect 200 that may be utilized to provide signal paths in a portion of a device configured to provide a movable or flexible joint, such as the flex regions described above for computing device 100. The interconnect 200 includes a plurality of traces 206 disposed on a flexible support structure 208, and extends between a first electrical component 202 in the form of a connector and a second electrical component 204 in the form of a circuit board having various electronic elements. A longitudinal axis 210 is shown for reference.

As mentioned above, solid metal traces in a flexible interconnect may become fatigued over time due to repeated flexing. As such, the traces 206 may eventually break, thereby disrupting a signal path between electrical components. Thus, to help avoid loss of connectivity, the traces 206 comprise a liquid metal portion in at least a flex region of the interconnect 200. Liquid metal can flow to fill the shape of a channel that holds the liquid metal, and therefore is not subject to the fatigue and breakage issues of metal traces when repeatedly bent. In various examples, the liquid metal may be used in place of a solid conductor, or may be used in addition to the solid conductor to provide self-healing capabilities for a solid metal trace when the solid metal trace breaks. As used herein, liquid metals may be defined as pure metals or metal alloys with a sufficiently low melting point (Tm) to be in a liquid state at room temperature. Non-limiting examples include eutectic gallium/indium (eGaIn), other gallium/indium alloys, eutectic gallium/indium/tin (Galinstan), and other gallium/indium/tin alloys. Solid conductors may be defined as electrical conductors having a Tm that is sufficiently above room temperature (e.g., higher than the Tm of liquid metals/conductors), such that the solid metal/conductor is solid at room temperature and at ordinary device operating temperatures.

Figure 3A:
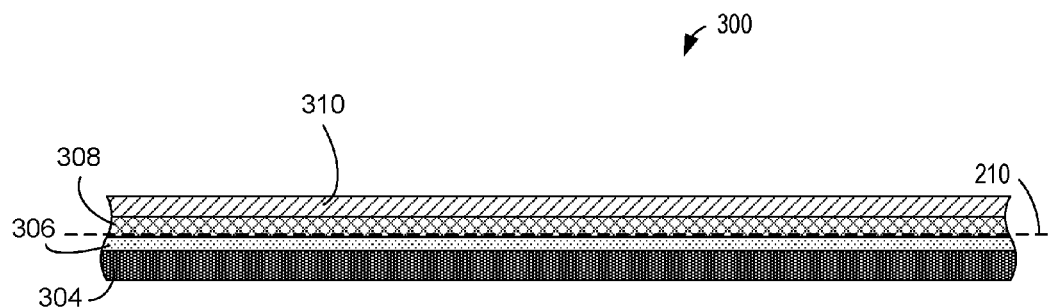
FIG. 3A shows a cross-sectional view of a first example structure for a flexible interconnect.
Figure 3B:
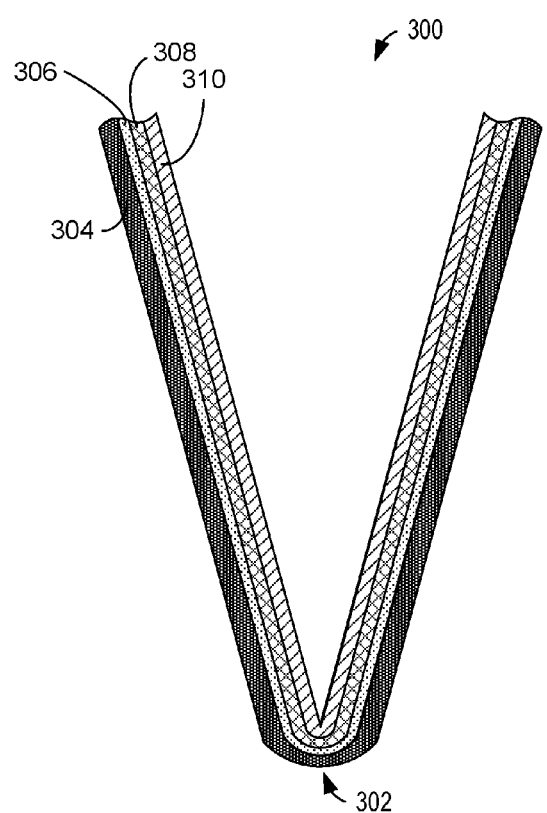
FIG. 3B shows a cross-sectional view of the interconnect of FIG. 3A in a flexed state.

FIGS. 3A and 3B show a sectional view of a portion of an example flexible interconnect 300, which may be used as interconnect 200 in FIG. 2. The longitudinal axis 210 is shown for reference. FIG. 3A shows the interconnect 300 in an unflexed state, and FIG. 3B illustrates the interconnect 300 flexed at location 302.

The interconnect 300 includes a flexible insulating support structure 304, a solid conductor 306, a liquid metal 308, and an encapsulating layer 310. The support structure 304 may be formed from any suitable electrically insulating, flexible material. In some examples, the support structure 304 is formed from a substantially non-stretchable material, while in other examples a stretchable material may be used, depending upon the device and joint in which the interconnect 300 is to be used. Examples of suitable materials include, but are not limited to, woven and non-woven fabrics, silicone polymers, flexible plastics, and other polymers (e.g. polyimides, polyethylene terephthalate polyurethanes, and acrylics). Further, in some examples, a composite substrate may be used, such as a fabric embedded with or coated with a polymer.

The solid conductor 306 is configured to form at least a portion of an electrical trace on the support structure 304. Any suitable solid conductor may be used, including but not limited to copper, gold, silver, aluminum, other conductive metals, and alloys thereof. The solid conductor 306 may be formed by printing, evaporation, masking techniques, etching techniques, and/or any other suitable metal deposition and patterning technique(s).

In some examples, the solid conductor 306 may include a core material and a barrier material that is different from the core material. The core material may be chosen for its electrical conductivity, mechanical properties, and/or other properties, and the barrier layer may prevent contact between the core material and the liquid metal layer to prevent any undesired alloying of the core material and the liquid metal. Such a barrier layer may be made from any material with a suitable resistance to alloying with the liquid metal and suitable electrical conductivity properties. Examples include, but are not limited to, titanium, chromium, nickel, molybdenum, and tungsten, in other examples, such a barrier layer may be omitted.

As mentioned above, the liquid metal conductor 308 helps to preserve a signal path when the solid metal conductor breaks. As such, the liquid metal conductor 308 is in contact with the solid conductor 306 along at least a flex region of the solid conductor 306. Any suitable liquid metal may be used that remains in a liquid phase within intended device operating temperature ranges. Examples include, but are not limited to, various alloys of gallium, such as indium/gallium and indium/gallium/tin alloys. The liquid metal 308 may be incorporated into the interconnect 308 in any desired manner. For example, an alloy of gallium may be deposited via a needle orifice or the like directly onto the solid conductor.

The outer surface of such an alloy, when exposed to air, forms a thin oxide layer that prevents the liquid metal from spreading, and thus retains the shape in which the liquid metal is initially deposited. In other examples, the encapsulating layer 310 may first be applied over the solid conductor 306, then a channel formed between the solid conductor 306 and the encapsulating layer 310 and then the liquid metal introduced into the channel (e.g. by injection or vacuum pulling). Other example deposition methods includes electrochemically depositing the liquid metal from a bath, or spreading the liquid metal onto the solid metal trace, where selective wetting between the liquid metal and the solid metal may constrain the shape of the liquid metal. In some examples, the solid conductor may be omitted for at least a portion of a trace, such that only the liquid metal carries current through that portion.

The encapsulating layer 310 helps to retain the liquid metal layer in a desired location, and electrically insulates the traces. The encapsulating layer 310 may be formed from any suitable material. In some examples, the encapsulating layer 310 may be formed at least partially from a silicone polymer, a polyimide, or another flexible, non-conductive polymer. The encapsulating layer contacts the support structure 304 in regions between traces 206, as illustrated in FIG. 2. The encapsulating layer may be deposited in any suitable manner, depending upon the polymer used. For example, a thermoplastic polymer encapsulant may be deposited by heating, spreading over the traces to be covered (whether prior to or after the addition of the liquid metal), and then cooling. As another example, a cross-linkable monomer or polymer may be cast onto the traces to be covered, and then cured. In yet another example, a pre-formed encapsulant film may be laminated to the support structure over the traces. Where the encapsulating layer is added prior to liquid metal inclusion, a channel may be formed at the interface of the solid metal trace and the encapsulating layer after formation of the encapsulating layer, and the liquid metal then may be added to the channel.

FIG. 3B illustrates example flexing of the interconnect 300 that may occur during use. As illustrated, the interconnect 300 may flex at a relatively sharp angle that places the solid conductive trace into compression or tensile states, depending upon the direction of flex. Over many cycles, a solid conductor may fatigue and eventually break in this region. However, inclusion of the liquid metal in this region, either alone (such that the liquid metal bridges a gap in a solid trace), or together with the solid conductor, may help to maintain an end-to-end conductive path even when the solid metal trace breaks. While one direction of flexing is shown in FIG. 3, the interconnect 300 also may flex in the opposite direction, either a different amount or an equal amount.

Figure 4A:
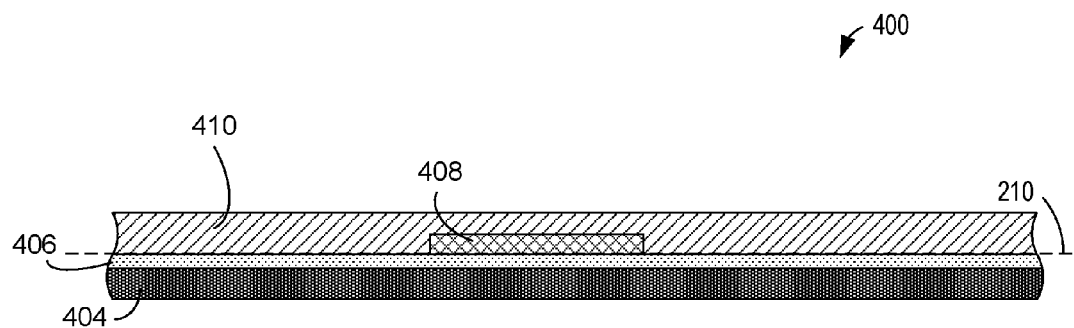
FIG. 4A shows a cross-sectional view of a second example structure for a flexible interconnect.
Figure 4B:
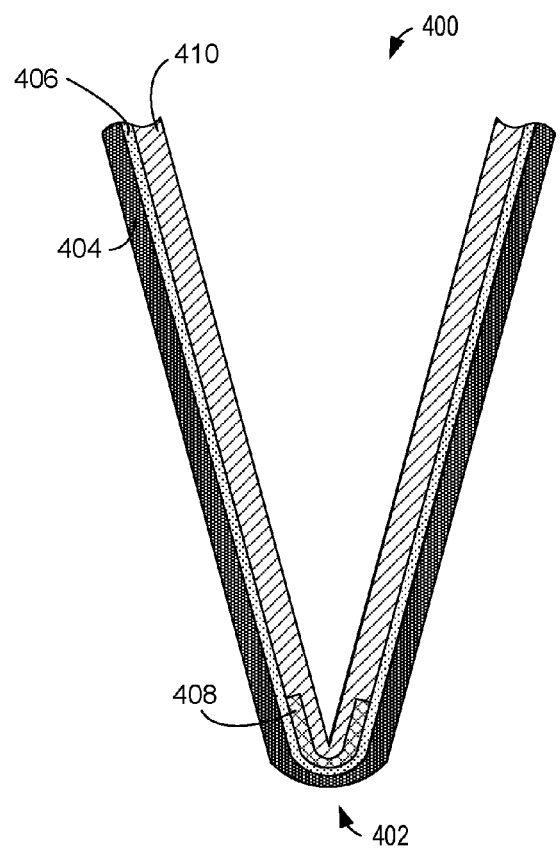
FIG. 4B shows a cross-sectional view of the interconnect of FIG. 4A in a flexed state.

FIGS. 4A and 4B show another example configuration of an interconnect 400 suitable for use as interconnect 200 of FIG. 2. FIG. 4A shows the interconnect in an unflexed state, and FIG. 4B shows the interconnect in an example flexed state. The interconnect 400 comprises a support structure 404, a solid metal conductor 406, a liquid metal 408, and an encapsulating layer 410, similar to those structures as described for interconnect 300. However, in FIGS. 4A and 4B, the liquid metal conductor 408 is provided in contact with the solid metal conductor 406 in regions where the interconnect is configured to flex, and not in one or more other regions not intended to flex when used in a device. This can be seen in FIG. 4B, where the liquid metal is located in and close to flex region 402, and not in other regions. As such, where an interconnect includes multiple regions configured to flex when installed in a device, the interconnect may include multiple segments of liquid metal over the solid metal conductor, wherein each liquid metal segment is separated by gaps from other liquid metal segments.

Figure 5:
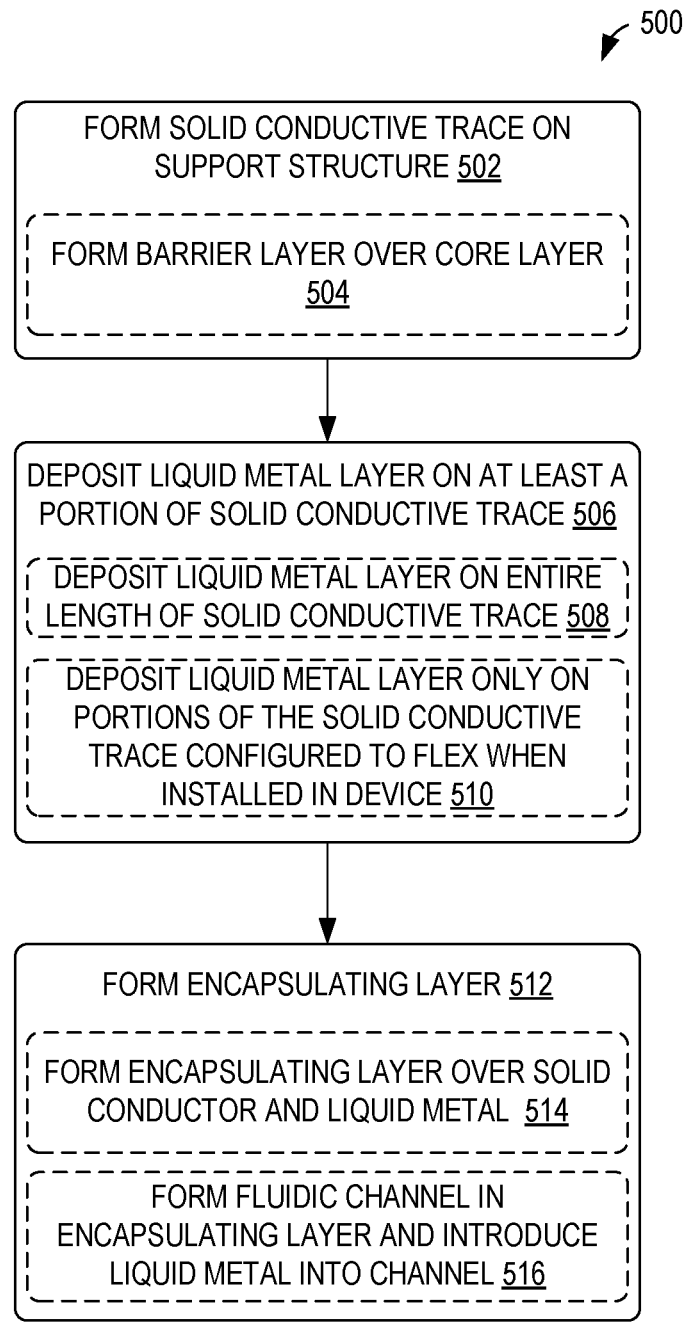
FIG. 5 shows a flow diagram depicting an example method for manufacturing a flexible circuit element.

FIG. 5 is a flow chart of an example method 500 for manufacturing a flexible circuit element. Method 500 may be utilized to manufacture interconnects 300 and 400, or any other suitable interconnects. At 502, method 500 includes forming, on a support structure, a solid conductive trace, such as a metallic trace. The trace may be formed in any suitable manner, including but not limited to printing, evaporation and other vapor phase techniques, plating, masking techniques, etching techniques, and/or any other suitable deposition technique(s). In some examples, as indicated at 504, the solid conductive trace may include a barrier layer formed over a core layer to prevent undesired alloying with the liquid metal, wherein the barrier layer and the core layer are both electrically conductive.

At 506, method 500 includes depositing a liquid metal conductor (e.g., a liquid metal conductive layer and/or trace) on the solid metal trace. As indicated at 508, method 500 may optionally include depositing the liquid metal conductor on the entire length of the solid metal trace (e.g., as illustrated in FIGS. 3A/3B), or, as indicated at 510, on portions of the solid metal trace that are configured to flex when installed in a device (e.g., as illustrated in FIGS. 4A/4B) but not one or more other portions. Forming the liquid metal conductor only in flex regions may reduce cost of the flexible circuit element compared to configurations where the liquid metal trace is disposed over the entire length of the solid metal trace. On the other hand, forming the liquid metal conductor over the entire length of the solid metal trace may provide additional protection against trace breakages compared to configurations where the liquid metal trace is only disposed over some regions of the solid metal trace.

The liquid metal conductor may be deposited in any suitable manner. For example, the liquid metal conductor may be deposited via a syringe in order to form a head/line of the liquid metal over the trace. In other examples, the liquid metal conductor may be deposited after formation of an encapsulating layer, for example by forming a microfluidic channel in the encapsulating layer and then introducing the liquid metal into the channel via vacuum or applied pressure. As another example, a nip roller or doctor bar may be used to pull the liquid metal across the surface after formation of the solid traces. The liquid metal will wet the solid traces and thus be deposited on the solid traces, while not wetting the substrate surface. In some examples, the solid traces may be treated with an acid or base to remove surface oxides prior to liquid metal deposition. Other examples of forming the liquid metal layer include electroplating, stencil lithography, evaporation utilizing a shadow mask for patterning, inkjet printing liquid metal in a volatile carrier solvent, and screen printing liquid metal (possibly with additives depending upon the liquid metal used).

Method 500 further includes, at 512, forming an encapsulating layer to encapsulate the liquid metal and hold the liquid metal in a desired location. The encapsulating layer also helps to electrically insulate the traces. The encapsulating layer may be formed in any suitable manner, including but not limited to those described above. Further, the encapsulating layer may be formed over the liquid metal and solid conductive traces, after deposition of the liquid metal conductor, as indicated at 514, or may be formed prior to deposition of the liquid metal conductor, e.g., where the liquid metal conductor is introduced into a fluidic channel formed in the encapsulating layer, as indicated at 516. In some examples, multiple layers of traces and encapsulant may be formed to manufacture a multi-layered conductive trace, wherein each layer of encapsulant act as a support structure for a next solid/liquid metal trace layer.

The examples disclosed herein may provide increased protection against signal path breakages compared to configurations that use only solid metal traces. Although the example flexible circuits described herein utilize a liquid metal and a solid metal in the described interconnects, additional examples may include using only liquid metal to form traces, such that the solid metal conductor of the above examples is replaced with a liquid metal conductor.

Another example provides a flexible circuit element, comprising a flexible insulating support structure, a solid metal trace extending at least partially between a first connector and a second connector on the flexible insulating support structure, and a liquid metal conductor disposed in contact with the solid metal trace in a region of the trace configured to repeatedly flex when installed in a device. In such an example the solid metal trace may additionally or alternatively extend fully between the first connector and the second connector. In such an example, the solid metal trace may additionally or alternatively comprise a gap in the region of the solid metal trace configured to repeatedly flex, and wherein the liquid metal conductor bridges the gap. In such an example, the solid metal trace may additionally or alternatively comprise a core material and a barrier material between the core material and the liquid metal. In such an example, the liquid metal conductor may additionally or alternatively comprise a gallium alloy. In such an example may additionally or alternatively further comprise a plurality of solid metal traces extending between the first connector and the second connector, each solid metal trace of the plurality of solid metal traces having a respective segment of liquid metal conductor disposed in contact with the solid metal trace. Such an example may additionally or alternatively further comprise an encapsulant at least partially encapsulating the liquid metal conductor. In such an example, the liquid metal conductor may additionally or alternatively extend fully between the first connector and the second connector. In such an example, the flexible circuit element may additionally or alternatively be installed in a device comprising a first electrical component and a second electrical component, the flexible circuit element extending between the first electrical component and the second electrical component. Any or all of the above-described examples may be combined in any suitable manner in various implementations.

Another example provides a flexible circuit element configured to couple a first electrical component and a second electrical component, the flexible circuit element comprising a flexible, non-stretchable, insulating support structure, and an electrical trace formed on the support structure, the electrical trace extending between a first connector located at a first location on the support structure and a second connector located at a second location on the support structure, and the electrical trace being formed at least partially from a liquid metal conductor. In such an example, the electrical trace may additionally or alternatively comprise a solid metal with a liquid metal disposed over and in contact with at least a portion of the solid metal. In such an example, the liquid metal may additionally or alternatively comprise a gallium alloy, and wherein the solid metal comprises copper. In such an example, the liquid metal may additionally or alternatively extend a portion of a length of the solid metal along the trace. Such an example may additionally or alternatively further comprise an encapsulant at least partially encapsulating the liquid metal. In such an example, the flexible, non-stretchable, insulating support structure may additionally or alternatively comprise a channel formed in a surface, and wherein the liquid metal is disposed within the channel. Any or all of the above-described examples may be combined in any suitable manner in various implementations.

Another example provides for a method of manufacturing a flexible circuit element, the method comprising forming, on a flexible support structure, a solid metal trace in contact with a liquid metal conductor, such that the solid metal trace and the liquid metal conductor form a conductive path along the flexible support structure to electrically connect a first electrical connector of a flexible circuit element and a second electrical connector of the flexible circuit element. Such an example may additionally or alternatively further comprise forming an encapsulating layer. In such an example, the encapsulating layer may alternatively or additionally be formed over the liquid metal conductor. In such an example, the liquid metal conductor may alternatively or additionally be deposited in a channel formed in the encapsulating layer. In such an example, the liquid metal conductor may alternatively or additionally be deposited after the solid metal trace. Any or all of the above-described examples may be combined in any suitable man various implementations.

It will be understood that the configurations and/or approaches described herein are presented for example, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A flexible circuit element, comprising:
a flexible insulating support structure;
a solid metal trace extending at least partially between a first connector and a second connector on the flexible insulating support structure; the solid metal trace comprising a gap in the region of the solid metal trace configured to repeatedly flex;
a liquid metal conductor disposed in contact with the solid metal trace in a region of the trace configured to repeatedly flex when installed in a device, the liquid metal conductor bridging the gap in the region of the solid metal trace; and
an encapsulate at least partially encapsulating the liquid metal conductor.

2. The flexible circuit element of claim 1, wherein the solid metal trace extends fully between the first connector and the second connector.

3. The flexible circuit element of claim 1, wherein the solid metal trace comprises a core material and a barrier material between the core material and the liquid metal.

4. The flexible circuit element of claim 1, wherein the liquid metal conductor comprises a gallium alloy.

5. The flexible circuit element of claim 1, further comprising a plurality of solid metal traces extending between the first connector and the second connector, each solid metal trace of the plurality of solid metal traces having a respective segment of liquid metal conductor disposed in contact with the solid metal trace.

6. The flexible circuit element of claim 1, wherein the liquid metal conductor extends fully between the first connector and the second connector.

7. The flexible circuit element of claim 1, wherein the flexible circuit element is installed in a device comprising a first electrical component and a second electrical component, the flexible circuit element extending between the first electrical component and the second electrical component.

8. A flexible circuit element configured to couple a first electrical component and a second electrical component, the flexible circuit element comprising:
a flexible, non-stretchable insulating support structure comprising a channel formed in a surface; and
an electrical trace formed on the support structure, the electrical trace extending between a first connector located at a first location on the support structure and a second connector located at a second location on the support structure, and the electrical trace being formed at least partially from a liquid metal conductor, wherein the liquid metal conductor extends a portion of a length of the solid metal along the trace, and wherein the liquid metal conductor is disposed in the channel.

9. The flexible circuit element of claim 8, wherein the electrical trace comprises a solid metal with a liquid metal disposed over and in contact with at least a portion of the solid metal.

10. The flexible circuit element of claim 9, wherein the liquid metal comprises a gallium alloy, and wherein the solid metal comprises copper.

11. The flexible circuit element of claim 8, further comprising an encapsulant at least partially encapsulating the liquid metal.

12. A method of manufacturing a flexible circuit element the method comprising:
forming, on a flexible support structure, a solid metal trace in contact with a liquid metal conductor, such that the solid metal trace and the liquid metal conductor form a conductive path along the flexible support structure to electrically connect a first electrical connector of a flexible circuit element and a second electrical connector of the flexible circuit element; and
forming an encapsulating layer over the liquid metal conductor.

13. The method of claim 12, wherein the liquid metal conductor is deposited in a channel formed in the encapsulating layer.

14. The method of claim 12, wherein the liquid metal conductor is deposited after the solid metal trace.

15. A flexible circuit element, comprising:
a flexible insulating support structure;
a solid metal trace extending fully between a first connector and a second connector on the flexible insulating support structure;
a liquid metal conductor disposed in contact with the solid metal trace in a region of the trace configured to repeatedly flex when installed in a device, wherein the liquid metal conductor comprises a gallium alloy; and
an encapsulant at least partially encapsulating the liquid metal conductor.

* * * * *